(12) United States Patent
Sporer

(10) Patent No.: US 11,264,689 B2
(45) Date of Patent: Mar. 1, 2022

(54) TRANSITION BETWEEN A WAVEGUIDE AND A SUBSTRATE INTEGRATED WAVEGUIDE, WHERE THE TRANSITION INCLUDES A MAIN BODY FORMED BY SYMMETRICAL HALVES

(71) Applicant: Rohde & Schwarz GmbH & Co. KG, Munich (DE)

(72) Inventor: Michael Sporer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 22 days.

(21) Appl. No.: 16/797,930

(22) Filed: Feb. 21, 2020

(65) Prior Publication Data

US 2021/0265715 A1    Aug. 26, 2021

(51) Int. Cl.
| | |
|---|---|
| *H01P 5/08* | (2006.01) |
| *H01P 1/02* | (2006.01) |
| *H01P 3/12* | (2006.01) |
| *H05K 1/02* | (2006.01) |

(52) U.S. Cl.
CPC .............. *H01P 5/087* (2013.01); *H01P 1/02* (2013.01); *H01P 1/022* (2013.01); *H01P 3/12* (2013.01); *H01P 3/121* (2013.01); *H01P 5/08* (2013.01); *H05K 1/0237* (2013.01)

(58) Field of Classification Search
CPC .......... H01P 5/087; H01P 5/107; H01P 1/022; H01P 1/025; H01P 1/027
USPC .......................................... 333/21 R, 26, 249
See application file for complete search history.

(56) References Cited

U.S. PATENT DOCUMENTS

| | | | | |
|---|---|---|---|---|
| 3,969,691 A | * | 7/1976 | Saul .......................... | H01P 1/16 333/21 R |
| 4,725,793 A | * | 2/1988 | Igarashi .................. | H01P 5/107 333/208 |
| 6,573,803 B1 | * | 6/2003 | Ziegner et al. ......... | H01P 5/107 333/26 |
| 7,230,507 B2 | | 6/2007 | Kroening | |
| 8,598,961 B2 | * | 12/2013 | Hasselblad et al. .... | H01P 1/025 333/21 R |
| 10,128,556 B2 | | 11/2018 | Ligander et al. | |
| 2009/0080832 A1 | | 3/2009 | Horine et al. | |
| 2014/0091884 A1 | * | 4/2014 | Flatters ................... | H01P 3/121 333/21 R |

FOREIGN PATENT DOCUMENTS

WO    2018/209422 A1    11/2018

* cited by examiner

*Primary Examiner* — Benny T Lee
(74) *Attorney, Agent, or Firm* — Christensen O'Connor Johnson Kindness PLLC

(57) ABSTRACT

A broadband transition coupling for transition between a waveguide and a printed circuit board with a substrate integrated waveguide is disclosed. The broadband transition coupling comprises a main body that encompasses an air-filled waveguide section and a transition section. The air-filled waveguide section comprises a first interface for the waveguide. The transition section provides a second interface for the printed circuit board. The transition section continuously tapers along the second interface in order to reduce a height of the transition section for transition coupling with the printed circuit board. Further, the present disclosure relates to a broadband system for processing electromagnetic signals.

15 Claims, 3 Drawing Sheets

TRANSITION BETWEEN A WAVEGUIDE AND A SUBSTRATE INTEGRATED WAVEGUIDE, WHERE THE TRANSITION INCLUDES A MAIN BODY FORMED BY SYMMETRICAL HALVES

FIELD OF THE DISCLOSURE

Embodiments of the present disclosure relate generally to a broadband transition coupling for transition between a waveguide and a printed circuit board with a substrate integrated waveguide (SIW). Further, embodiments of the present disclosure relate generally to a broadband system for processing electromagnetic signals.

BACKGROUND

Nowadays, waveguides such as hollow conductors, also called air-filled waveguides, are used instead of coaxial cables for processing electromagnetic signals with high frequencies, namely electromagnetic signals in the microwave range or in the millimeter wave range, due to higher robustness and less attenuation.

However, a signal conditioning of the electromagnetic signals is typically done by means of a planar circuit provided on a printed circuit board with a substrate integrated waveguide (SIW), for instance. Accordingly, a transition from the waveguide to the printed circuit board is necessary such that the electromagnetic signals processed in the waveguide can be coupled into the substrate integrated waveguide. Typically, the substrate integrated waveguide comprises an upper metal layer, a dielectric layer, and a lower metal layer, wherein the dielectric layer is sandwiched between the metal layers. The side walls of the substrate integrated waveguide are typically made by rows of plated vias and connect both metal layers. The electromagnetic signals coupled into the substrate integrated waveguide propagate along a longitudinal extension of the substrate integrated waveguide in a confinement limited by the metal layers and the walls established by the vias.

In the state of the art, different techniques for providing the transition coupling between the waveguide and the printed circuit board are known. However, the respective transition couplings known are limited with regard to their bandwidth.

SUMMARY OF THE DISCLOSURE

Accordingly, there is a need, among others, for a broadband transition coupling as well as a broadband system, ensuring broadband transition of the electromagnetic signals.

The present disclosure provides a broadband transition coupling for transition between a waveguide and a printed circuit board with a substrate integrated waveguide, SIW. In an embodiment, the broadband transition coupling comprises a main body that encompasses an air-filled waveguide section as well as a transition section. The air-filled waveguide section comprises a first interface for the waveguide. The transition section provides a second interface for the printed circuit board. The transition section continuously tapers along the second interface in order to reduce a height of the transition section for transition coupling with the printed circuit board.

Further, the present disclosure provides a broadband system for processing electromagnetic signals. In an embodiment, the broadband system comprises a printed circuit board with a substrate integrated waveguide, and a broadband transition coupling for transition between a waveguide and the printed circuit board. The printed circuit board has a top layer on which the broadband coupling is placed. The printed circuit board comprises a recessed coupling region in the top layer, wherein the recessed coupling region has an air-filled portion. The broadband transition coupling comprises a main body that encompasses an air-filled waveguide section and a transition section. The air-filled waveguide section comprises a first interface for the waveguide. The transition section provides a second interface for the printed circuit board. The transition section tapers along the second interface in order to reduce a height of the transition section for transition coupling with the printed circuit board. The air-filled portion of the recessed coupling region is assigned to the transition section of the broadband transition coupling.

Accordingly, a broadband transition coupling is provided, which continuously tapers along the second interface, via which the transition coupling is connected with the printed circuit board. Hence, a step-less tapering of the transition section used for processing the electromagnetic signals is ensured such that a broadband transition is obtained by the transition coupling.

In addition, the printed circuit board has, in some embodiments, a recessed coupling region within the top layer of the printed circuit board, namely the uppermost dielectric layer of the printed circuit board, such that an air-filled portion can be provided by the printed circuit board at least partly in the assembled state of the broadband system.

Accordingly, the height of the transition section is reduced by the tapering to a height of the air-filled portion of the recessed coupling region in a continuous manner. Thus, the electrically conducting transition section merges into the air-filled portion of the recessed coupling region, which is also an electrically conducting section. The tapering of the transition section ensures that a continuous transition is provided between the transition section and the air-filled portion of the recessed coupling region.

In some embodiments, the air-filled portion of the recessed coupling region within the printed circuit board corresponds to a kind of air-filled waveguide that is established by the recessed coupling region, for example the edges of the recessed coupling region, and the electrically conducting transition section of the broadband transition coupling, which is placed on the recessed coupling region of the printed circuit board.

Generally, the air-filled waveguide section and the transition section are connected with each other in an electrically conductive manner such that electromagnetic signals can propagate from the air-filled waveguide section to the transition section and vice versa.

Since the air-filled portion of the recessed coupling region is assigned to the transition section of the broadband transition coupling, an air-filled waveguide is established, which extends from the first interface to the air-filled portion of the recessed coupling region within the printed circuit board. Thus, the electromagnetic signals can propagate from the air-filled waveguide section, for example the end facing the first interface, to the air-filled portion of the recessed coupling region of the printed circuit board and vice versa.

The first interface of the broadband transition coupling can be established by a flange such that the respective waveguide can be connected with the broadband transition coupling by a plug connection and/or a screw connection, for instance a bayonet fastening.

Furthermore, the entire printed circuit board can be manufactured in a typical manner such that no specific materials and/or manufacturing techniques are necessary. For instance, the recessed coupling region is milled in the top layer of the printed circuit board. Thus, the recessed coupling region can be manufactured easily and cost-efficiently.

Moreover, no radiating elements are required for establishing the respective transition from the broadband transition coupling to the printed circuit board. Put differently, the broadband transition coupling as well as the broadband system can be established without a radiating element. This reduces the costs for the printed circuit board, as no specific manufacturing techniques or special adaptions are necessary despite of the recessed coupling region within the top layer of the printed circuit board, which however can be obtained by milling.

An aspect provides that the air-filled waveguide section and the transition section merge into each other via a bent section having a defined curvature. The defined curvature of the bent section ensures that a defined radius is provided, ensuring optimal electromagnetic characteristics of the entire broadband transition coupling.

In some embodiments, the bent section has a base facing away from the waveguide section. The base provides a supporting area for the broadband transition coupling. The broadband transition coupling can be placed on the printed circuit board via the supporting area located on a surface of the base, which faces away from the waveguide section. Put differently, the supporting area is located at a surface of the base, which points away from the transition coupling.

Accordingly, the air-filled waveguide section and the transition section may merge into each other via a bent section having a defined curvature. The bent section may have a base facing away from the waveguide section. The base may provide a supporting area, wherein the broadband transition coupling may contact a surface within the recessed coupling region via the supporting area. In other words, the broadband transition coupling is placed on the printed circuit board such that the supporting area provided on the base of the transition coupling (directly) contacts a surface within the recessed coupling region.

The surface of the recessed coupling region, which is contacted by the supporting area, may be provided by a metal layer, namely a lower metal layer of the substrate integrated waveguide, SIW. The lower metal layer is the one that is positioned below the top layer of the printed circuit board. However, the top layer of the printed circuit board was recessed within the recessed coupling region such that the lower metal layer of the substrate integrated waveguide was uncovered, thereby establishing the outer surface within the recessed coupling region. Accordingly, the supporting area of the base may contact this lower metal layer of the substrate integrated waveguide.

Another aspect provides that the air-filled waveguide section and the transition section extend in (substantially) perpendicular directions in some embodiments. Thus, the bent section ensures that a change in direction of the electrically conducting sections is provided, namely from the air-filled waveguide section to the transition section.

Generally, the respective waveguide can be connected at any location/angular position with respect to the printed circuit board, as the air-filled waveguide section with the first interface at the free end of the air-filled waveguide section can be inclined with respect to the transition section by any angle desired. In some embodiments, a propagation direction of the electromagnetic signals can be changed by the bent section appropriately, for instance by substantially 90°.

An embodiment provides that the air-filled waveguide section and the transition section are at least partly established by a common monolithic part. Thus, a single monolithic part, namely the common monolithic part, comprises at least a part of the air-filled waveguide section and the transition section simultaneously. This also means that the interfaces of the transition coupling are provided at the common monolithic part at least partly.

For instance, the main body is established by two halves. Hence, the entire transition coupling can be established by these halves that can be interconnected with each other in order to establish the entire transition coupling. Each half of the main body may comprise a respective half of the air-filled waveguide section and a respective half of the transition section. Both halves together establish the entire air-filled waveguide section and the entire transition section.

In some embodiments, each half is established by a monolithic part. Thus, two common monolithic parts may be provided, wherein each of the two common monolithic parts comprises the air-filled waveguide section and the transition section in parts, namely a respective half thereof.

For instance, each half provides a channel-like portion of the air-filled waveguide section and a channel-like portion of the transition section. The channel-like portions are established at outer surfaces of the respective halves, wherein these outer surfaces correspond to the connecting surfaces in which both halves are interconnected with each other. In the assembled state, the channel-like portions face each other through respective open areas in order to establish the air-filled waveguide section and the transition section together.

Generally, the channel-like portions can be established in the respective halves easily, for instance by milling.

Therefore, both halves may be symmetrically identical with respect to a center plane of the air-filled waveguide section and the transition section. When connecting both halves, optimal electromagnetic characteristics of the respective waveguide section and the transition section can be ensured. The center plane of the air-filled waveguide section and the transition section corresponds to the connecting plane of the halves. In other words, the outer surfaces or rather the connecting surfaces of the halves together define the center plane of the transition coupling in the assembled state.

The waveguide section may have a rectangular cross section. Thus, a typical hollow rectangular waveguide can be connected by the first interface of the transition coupling.

An aspect provides that the recessed coupling region merges into the substrate integrated waveguide in some embodiments. The electromagnetic signals are coupled into the recessed coupling region, for example the air-filled portion of the recessed coupling region, from the transition coupling, for example the transition section. Then, the electromagnetic signals propagate from the recessed coupling region, for example the air-filled portion, to the substrate integrated waveguide for further processing.

Another aspect provides that the transition section continuously tapers along the second interface in order to reduce the height of the transition section to a height of the air-filled portion of the recessed coupling region. The respective transition from the transition coupling, namely the transition section of the transition coupling, to the printed circuit board, for example the recessed coupling portion region of the printed circuit board, is ensured by adapting the height of the transition section accordingly, namely reducing the height of the transition section until the height of the transition section corresponds to the height of the air-filled portion of the recessed coupling region within the printed circuit board.

Another aspect provides that a matching structure is provided in the recessed coupling region in some embodiments. The matching structure is located between the substrate integrated waveguide and the air-filled portion of the recessed coupling region. The electromagnetic signals received from the transition coupling via the air-filled portion of the recessed coupling region are initially processed by the matching structure prior to propagating to the substrate integrated waveguide for further processing.

Generally, the substrate integrated waveguide (SIW) is also known as post-wall waveguide or laminated waveguide. Typically, the substrate integrated waveguide is a synthetic rectangular electromagnetic waveguide formed in a dielectric layer by densely arraying metallized posts or via-holes which connect the upper and lower metal layers sandwiching the dielectric layer.

Further, a waveguide can be a hollow metal pipe used to carry radio waves. The waveguide may have a rectangular cross section. Typically, a waveguide is used in radio-frequency engineering and communications engineering to transmit signals with high frequencies, for example signals in the microwave range or in the millimeter wave range.

BRIEF DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION OF THE DISCLOSURE

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
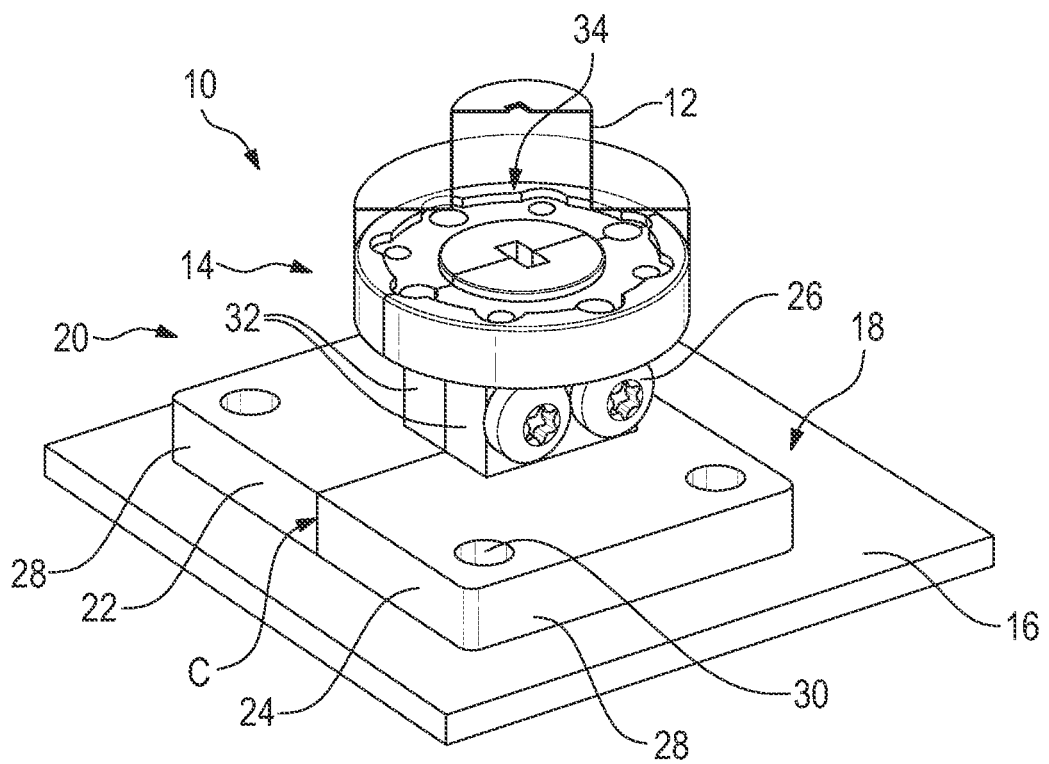
FIG. 1 schematically shows a representative embodiment of a broadband system for processing electromagnetic signals according to the present disclosure, which comprises an example broadband transition coupling according to the present disclosure.

FIG. 1 shows a broadband system 10 for processing electromagnetic signals. The broadband system 10 comprises a waveguide 12 illustrated partly in a semi-transparent manner, a broadband transition coupling 14 as well as a printed circuit board 16 with a substrate integrated waveguide (SIW) 18. Generally, the broadband transition coupling 14 provides a transition between the waveguide 12 having an electrically conducting portion with a substantially rectangular cross section to the printed circuit board 16, namely the substrate integrated waveguide 18.

In the embodiment shown, the broadband transition coupling 14 has a main body 20 that is established by two symmetrically identical halves 22, 24 that are interconnected with each other by screws 26 or other fasteners in the assembled state (FIG. 1). In some embodiments, the halves 22, 24 are symmetrically identical with respect to a center plane C of the broadband transition coupling 14, which corresponds to the connection plane of the halves 22, 24.

The halves 22, 24 of the main body 20 each comprise a mounting portion 28 by which the halves 22, 24 can be connected with the printed circuit board 16, for example by using fastening members (not shown) that are fed through openings 30 in the mounting portions 28. Further, each half 22, 24 of the main body 20 has an upright portion 32 that extends from the mounting portion 28 towards the waveguide 12 that is connected via a first interface 34 to the transition coupling 14.

The transition coupling 14 also includes a second interface 36 that is used to provide the transition to the printed circuit board 16. The respective second interface 36 is shown in FIG. 2 as well as in FIG. 3 in more detail.

Figure 2:
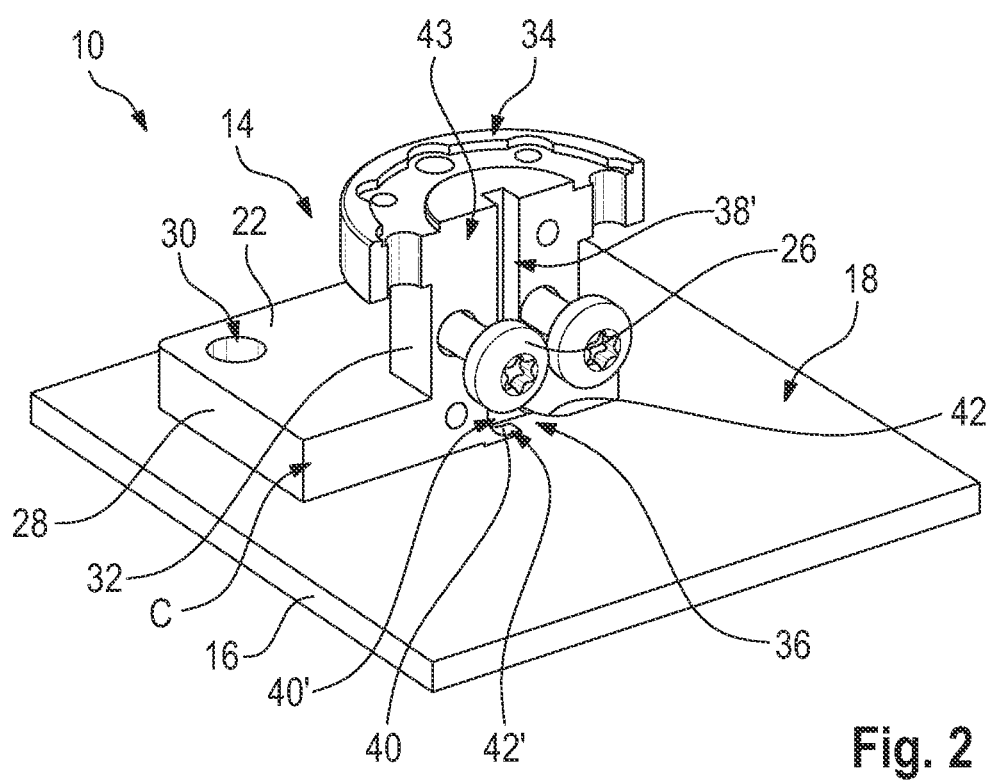
FIG. 2 schematically shows a partly transparent illustration of FIG. 1, as the second half of the main body of the transition coupling is not illustrated.
Figure 3:
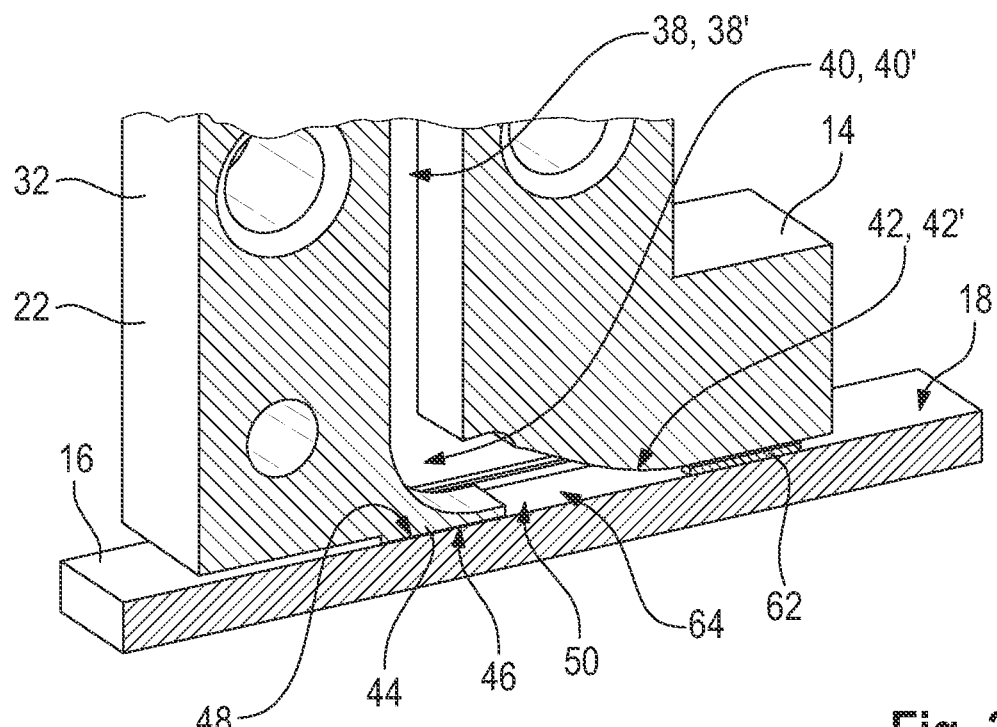
FIG. 3 shows a cross sectional view of a detail of the broadband system shown in FIG. 1.

FIGS. 2 and 3 also reveal that the transition coupling 14 has an air-filled waveguide section 38 that originates from the first interface 32 towards the printed circuit board 16. The air-filled waveguide section 38 merges into a bent section 40, which in turn merges into a transition section 42 that ends in the second interface 36 (see FIGS. 2 and 3).

In some embodiments, the bent section 40 has a defined curvature such that the air-filled waveguide section 38 and the transition section 42 merge into each other via the bent section 40 in a defined manner, namely via a pre-defined radius. The bent section 40, in some embodiments, provides in total a substantially 90° deflection of the propagation direction of the electromagnetic signals propagating along the electrically conductive portion of the transition coupling 14, yielding substantially perpendicular extension directions of the air-filled waveguide section 38 and the transition section 42.

FIG. 2 illustrates that the halves 22, 24 (FIG. 1) of the main body 20 (FIG. 1) are each established by a monolithic part, wherein each half 22, 24 provides a channel-like portion 38' of the air-filled waveguide section 38 (FIG. 3), a channel-like portion 40' of the bent section 40 as well as a channel-like portion 42' of the transition section 42.

The channel-like portions 38', 40' and 42' (FIG. 3) may be provided in an outer surface 43 of the respective monolithic part, wherein the respective outer surface 43 corresponds to a connecting surface via which the halves 22, 24 contact each other in the assembled state. For instance, the channel-like portions 38', 40' and 42' (FIG. 3) are milled in the outer surface 43.

In an assembled state of the broadband transition coupling 14, for example the main body 20, the halves 22, 24 contact each other via their respective outer surfaces 43 facing each other in the assembled state. Since the halves 22, 24 are symmetrically identical with respect to the center plane C of the broadband transition coupling 14, for example the air-filled waveguide section 38 (FIG. 3) and the transition section 42, optimal electromagnetic characteristics of the electrically conducting portion of the transition coupling 14 are ensured. In some embodiments, the center plane C intersects the substantially rectangular cross section of the waveguide section 38 in the middle of the waveguide section 38 as shown in FIGS. 1 and 3.

Furthermore, both halves 22, 24 are connected with each other in the assembled state such that the respective channel-like portions 38', 40' and 42' (FIG. 3) together form the air-filled waveguide section 38, the bent section 40 as well as the transition section 42. The channel-like portions 38', 40' and 42' (FIG. 3) face each other via their open areas in order to establish the air-filled waveguide section 38 (FIG. 3), the bent section 40 as well as the transition section 42. In other words, the air-filled waveguide section 38, the bent section 40 and/or the transition section 42 are at least partly established by the common monolithic parts, namely the respective halves 22, 24 of the main body 20.

The transition section 42 originating from the bent section 40 continuously tapers along the second interface 36 (FIG. 2) such that the height of the transition section 42 is reduced for transition coupling with a printed circuit board 16, as shown in FIG. 3.

Moreover, the bent section 40 has a base 44 that faces away from the waveguide section 38. The base 44 provides a supporting area 46 via which the transition coupling 14 is placed on the printed circuit board 16. Accordingly, the supporting area 46 directly contacts a surface 48 of the printed circuit board 16, which is provided in a recessed coupling region 50 that is assigned to the transition coupling 14.

Figure 4:
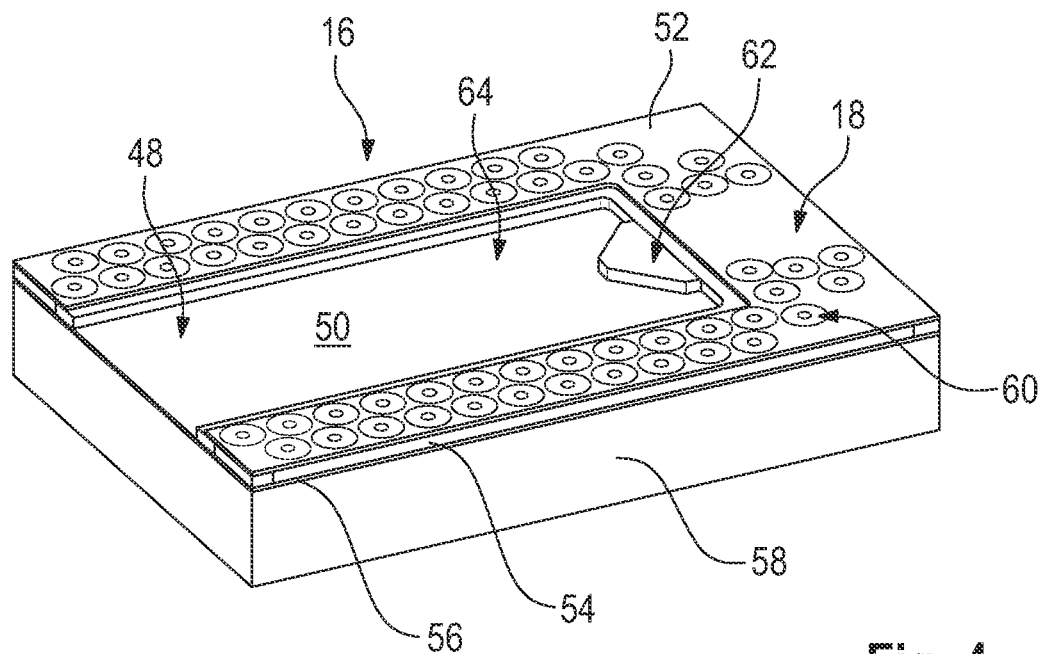
FIG. 4 shows a perspective view on a printed circuit board used by the broadband system shown in FIG. 1.

The printed circuit board 16 is shown in FIG. 4 in more detail.

As mentioned above, the printed circuit board 16 comprises the substrate integrated waveguide 18 that is established by a first metal layer 52, a top layer 54 of the printed circuit board 16 that is provided by a dielectric material as well as a second (lower) metal layer 56, which is located between the top layer 54 and an intermediate or lower layer 58 of the printed circuit board 16. In the shown embodiment, the respective metal layers 52, 56 are interconnected with each other via different vertical interconnect accesses (VIAs) 60.

The printed circuit board 16 may also comprise a matching structure 62 that is located between the recess coupling region 50 and the substrate integrated waveguide 18. In some embodiments, the matching structure 62 may be established by the top layer 54.

In general, the broadband transition coupling 14 is placed on the printed circuit board 16 such that the second interface 36 (FIG. 2) is located above the recessed coupling region 50. In some embodiments, the second interface 36 (FIG. 2) and the recessed coupling region 50 are assigned with each other.

The recessed coupling region 50 is located within the top layer 54 (FIG. 4), which means that the top layer 54 is recessed in this respective region 50. Thus, the material of the top layer 54 removed in the recessed coupling region 50, for instance by milling.

Hence, an air-filled portion 64 is provided between the second interface 36 (FIG. 2) of the transition coupling 14 and the respective surface 48 of the printed circuit board 16 within the recessed coupling region 50. In some embodiments, the surface 48 is established by the lower metal layer 56, as the top layer 54 was recessed in this respective region 50. In other words, the dielectric material of the top layer 54 was removed when providing the recessed coupling region 50.

This results in the air-filled portion 64 that is used for conducting the electromagnetic signals provided via the second interface 36 (FIG. 2) towards the matching structure 62 and the substrate integrated waveguide 18. Accordingly, the printed circuit board 16 partly establishes a kind of air-filled waveguide by the air-filled portion 64 provided due to the recessed coupling region 50 within the printed circuit board 16. In some embodiments, the kind of air-filled waveguide is established by the lower metallic layer 56, the lateral edges provided by the dielectric material of the top layer 54, as well as the electrically conducting transition section 42 of the transition coupling 14 placed on the recessed coupling region 50.

When assembling the broadband system 10, the base 44 (FIG. 3) of the transition coupling 14 is placed via the supporting area 46 of the base 44 on the lower metal layer 56 that establishes the respective contact surface 48 for the supporting area 46.

The transition section 42 continuously tapers along the second interface 36 as mentioned above, wherein the height of the transition section 42 is reduced to the height of the air-filled portion 64 of the recessed coupling region 50 as shown in FIG. 3.

The air-filled portion 64 of the recessed coupling region 50 within the printed circuit board 16 is limited by the lower metallic layer 56 and the lateral edges provided by the dielectric material of the top layer 54.

Furthermore, FIG. 4 reveals that the first metallic layer 52, namely the upper layer, is laterally recessed with respect to the material of the dielectric material of the top layer 54.

In the assembled state of the broadband system 10, the lateral edges provided by the dielectric material of the top layer 54 may laterally contact the base 44, which ensure that no electrical contact between the base 44 and the upper metallic layer 52 is provided. In some embodiments, the base 44 is in electrical contact with the lower metallic layer 56 via the supporting area 46 established on the surface of base 44 facing towards the printed circuit board 16.

Furthermore, the height of the transition section 42 may reduce along the second interface 36 such that the transition coupling 14 contact the upper metallic layer 52 in an area assigned to the free end of the transition section 42, namely the one facing away from the bent section 40. Hence, an electrical contact between the upper metallic layer 52 and a portion of the transition coupling 14 limiting the transition section 42 is provided.

Figure 5:
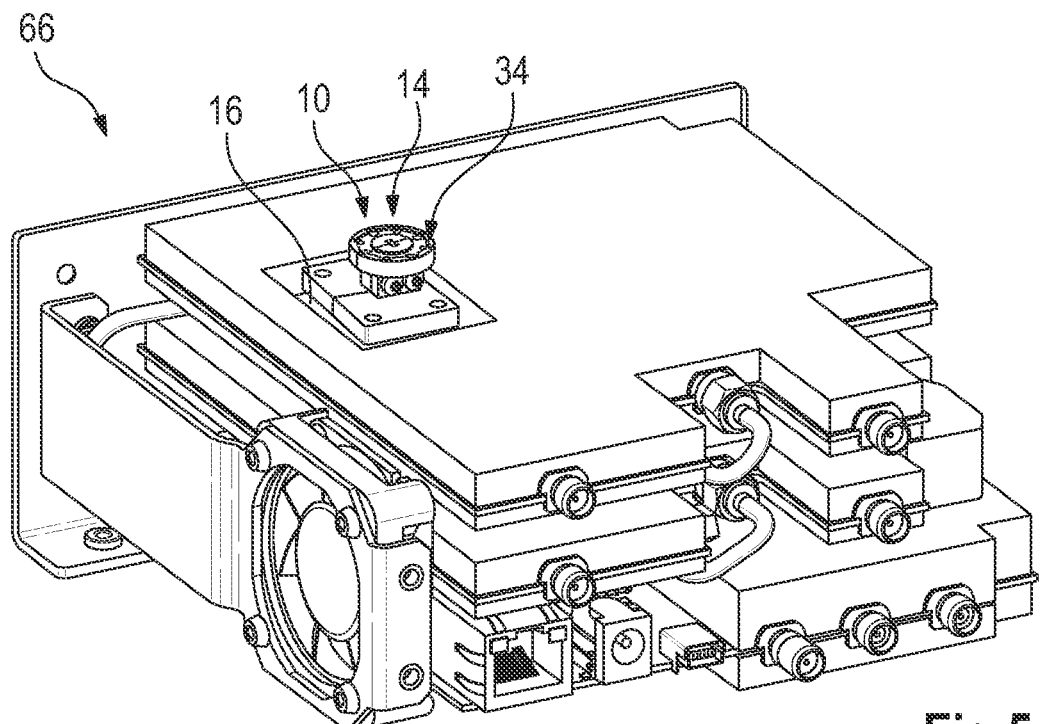
FIG. 5 shows a test and/or measurement device partly, which has the broadband system of FIG. 1 implemented.
Figure 6:
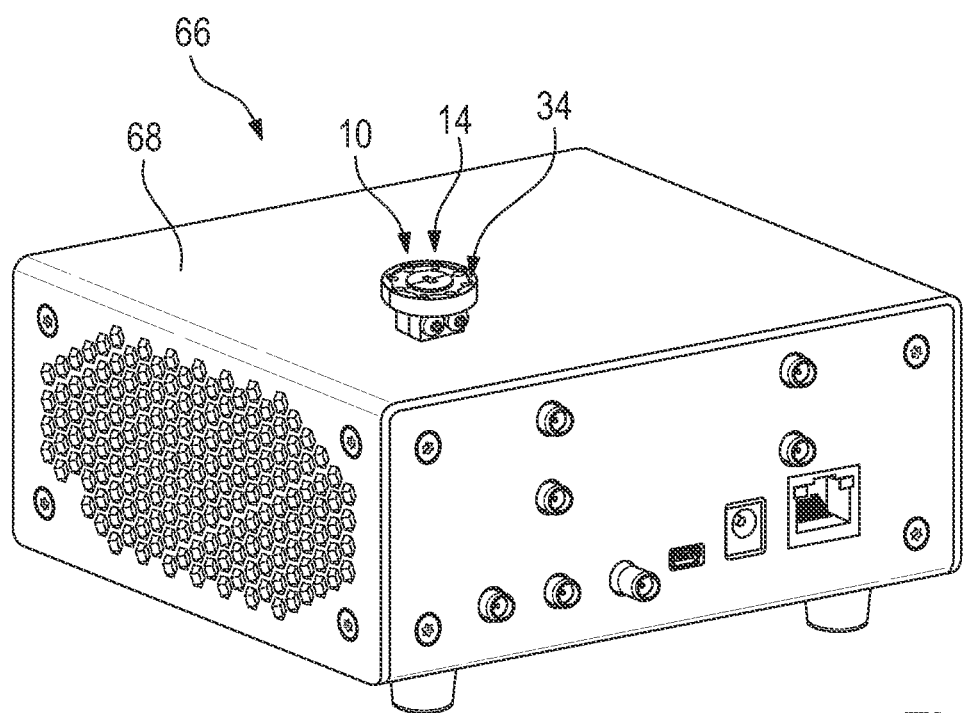
FIG. 6 shows the test and/or measurement device of FIG. 5 in a fully assembled state.

In FIGS. 5 and 6, a test and/or measurement device 66 is shown that comprises the broadband system 10 shown before. Hence, the respective broadband system 10 is integrated in the test and/or measurement device 66.

As illustrated in FIG. 6, the first interface 34 used for interconnecting a waveguide 12 (FIG. 1), for instance a hollow conductor, can be established at any position on an external housing 68 of the test and/or measurement device 66 such that easy access can be ensured.

Generally, the system 10 ensures that the entire frequency range of the waveguide 12 can be used, as the system 10 is broadband, for example the transition coupling 14 of the system 10.

In some embodiments, electromagnetic signals with frequencies between 60 and 90 GHz can be processed by the broadband system 10.

In some embodiments, the entire broadband system 10 comprises, consists of, or consists essentially of the transition coupling 14, also called waveguide adapter, and the printed circuit board 16. The printed circuit board 16 has the specific structure, namely the recessed coupling region 50 with the air-filled portion 64, which interacts with the transition section 42 of the transition coupling 14.

The transition coupling 14 itself consists of two symmetrically identical halves 22, 24 having the channel-like portions 38', 40', 42', wherein the halves 22, 24, for example the respective channel-like portions 38', 40', 42', together establish the waveguide section 38, the bent section 40 as well as the transition section 42 in the assembled state of the transition coupling 14.

The channel-like portions 38', 40', 42' are preferably milled in the respective outer surfaces 43 of the halves 22, 24, via which the halves 22, 24 contact each other in the assembled state.

The respective components of the system 10, for example the components of the transition coupling 14, can be manufactured in a cost-efficient and simple manner.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A broadband transition coupling for transition between a waveguide and a printed circuit board with a substrate integrated waveguide, said broadband transition coupling comprising:
   a main body that encompasses an air-filled waveguide section and a transition section, said air-filled waveguide section comprising a first interface for said waveguide, said transition section providing a second interface for said printed circuit board, said transition section continuously tapering along said second interface in order to reduce a height of said transition section for transition coupling with said printed circuit board, wherein said main body is established by two halves, wherein each half of the main body comprises a respective half of the air-filled waveguide section and a respective half of the transition section, and wherein both halves are symmetrically identical with respect to a center plane of said air-filled waveguide section and said transition section.

2. The broadband transition coupling according to claim 1, wherein said air-filled waveguide section and said transition section merge into each other via a bent section having a defined curvature.

3. The broadband transition coupling according to claim 2, wherein said bent section has a base, said base providing a supporting area for said broadband transition coupling, wherein said supporting area is located on a surface of said base, and wherein said surface faces away from said waveguide section towards said printed circuit board.

4. The broadband transition coupling according to claim 1, wherein said air-filled waveguide section and said transition section extend in substantially perpendicular directions.

5. The broadband transition coupling according to claim 1, wherein said waveguide section has a rectangular cross section.

6. The broadband transition coupling according to claim 1, wherein said transition section continuously tapers along said second interface in a step-less manner.

7. The broadband transition coupling according to claim 1, wherein each half is established by a monolithic part.

8. The broadband transition coupling according to claim 1, wherein each half provides a channel-like portion of said air-filled waveguide section and a channel-like portion of said transition section.

9. A broadband system for processing electromagnetic signals, said broadband system comprising:
   a printed circuit board with a substrate integrated waveguide, and a broadband transition coupling for transition between a waveguide and said printed circuit board,
   wherein said printed circuit board has a top layer on which said broadband transition coupling is placed, said printed circuit board comprising a recessed coupling region in said top layer, said recessed coupling region having an air-filled portion;
   wherein said broadband transition coupling comprises a main body that encompasses an air-filled waveguide section and a transition section, said air-filled waveguide section comprising a first interface for said waveguide, said transition section providing a second interface for said printed circuit board, said transition section tapering along said second interface in order to reduce a height of said transition section for transition coupling with said printed circuit board; and
   wherein said air-filled portion of said recessed coupling region interacts with said transition section of said broadband transition coupling.

10. The broadband system according to claim 9, wherein said air-filled waveguide section and said transition section merge into each other via a bent section having a defined curvature, said bent section having a base, said base providing a supporting area, said broadband transition coupling contacting a surface within said recessed coupling region via said supporting area.

11. The broadband system according to claim 9, wherein a matching structure is provided in said recessed coupling region, said matching structure being located between said substrate integrated waveguide and said air-filled portion of said recessed coupling region.

12. The broadband system according to claim 9, wherein said recessed coupling region merges into said substrate integrated waveguide.

13. The broadband system according to claim 9, wherein said transition section continuously tapers along said second interface in order to reduce a height of said transition section to a height of said air-filled portion of said recessed coupling region.

14. A broadband transition coupling for transition between a waveguide and a printed circuit board with a substrate integrated waveguide, said broadband transition coupling comprising:
- a main body that encompasses an air-filled waveguide section and a transition section, said air-filled waveguide section comprising a first interface for said waveguide, said transition section providing a second interface for said printed circuit board, said transition section continuously tapering along said second interface in order to reduce a height of said transition section for transition coupling with said printed circuit board;
- wherein said air-filled waveguide section and said transition section merge into each other via a bent section having a defined curvature;
- wherein said bent section has a base with a supporting area; and
- wherein said supporting area provided on said base directly contacts a surface within a recessed coupling region of said printed circuit board.

15. The broadband transition coupling according to claim 14, wherein said transition section continuously tapers along said second interface in a step-less manner.

* * * * *